United States Patent
Freuler et al.

[11] Patent Number: 5,912,805
[45] Date of Patent: Jun. 15, 1999

[54] THERMAL INTERFACE WITH ADHESIVE

[76] Inventors: Raymond G. Freuler, 25865 Cordova, Laguna Hills, Calif. 92653; Gary E. Flynn, 6 Calle de Princesa, Coto de Caza, Calif. 92679

[21] Appl. No.: 09/186,236

[22] Filed: Nov. 4, 1998

[51] Int. Cl.[6] .................................................. H05K 7/20
[52] U.S. Cl. .................. 361/705; 361/683; 361/704; 361/705; 257/713; 257/692; 428/343; 165/80.3; 156/346
[58] Field of Search ..................... 361/683–687, 361/690–697, 702–719, 306.2, 321.1; 174/16.3, 52.4, 138 G, 659; 257/666, 678, 687, 707–713, 692, 737, 718; 165/80.3, 80.4, 104.19, 84, 185; 156/89.24, 250, 247, 89.23, 346; 428/343, 40.4, 40.1, 118, 34.9, 209, 220; 29/842, 827, 855, 841, 846

[56] References Cited

U.S. PATENT DOCUMENTS

| | | | |
|---|---|---|---|
| 4,482,912 | 11/1984 | Chiba et al. | 357/67 |
| 4,810,563 | 3/1989 | DeCree et al. | 428/209 |
| 4,842,911 | 6/1989 | Fick | 428/40 |

OTHER PUBLICATIONS

Power Devices, Inc.; "Kapton MT Substrate Coated with High Performance Thermal Compound in Easy–to–Use Form"; 1996; 2 pages; Laguna Hills.
Chomerics; "ThermFlow T705 and T710 Low Thermal Resistance Interface Pads"; 1997; 2 pages.
Chomerics; "ThermFlow T413 and T414 Low Thermally Conductive Adhesive Tapes"; 1994; 3 pages.
Chomerics; "ThermFlow T404 and T405 Low Thermally Conductive Adhesive Tapes"; 1993; 4 pages.
The Bernquist Company; "Sil–Pad Design Guide"; 1993, 22 pages.

*Primary Examiner*—Leo P. Picard
*Assistant Examiner*—Michael Datskovsky
*Attorney, Agent, or Firm*—Stetina Brunda Garred & Brucker

[57] ABSTRACT

A thermal interface for facilitating heat transfer from an electronic component to a heat sink. According to a preferred embodiment, the thermal interface comprises first and second generally planar substrates that are compressively bonded to one another. The first substrate has outer periphery that defines a first continuous peripheral edge. The second substrate has an outer periphery that defines a second continuous peripheral edge with at least a portion thereof extending beyond the first peripheral edge of the first substrate. An adhesive is deposited upon the portion of the second substrate extending beyond the peripheral edge of the first substrate, and preferably beyond the interface surface between the electronic component and the heat sink such that the thermal interface may be adhesively secured into position without forming an additional layer therebetween. Layers of conformable heat-conducting material are formed upon the outwardly-facing opposed sides of the bonded substrates to enhance the heat transfer from the electronic component to the heat sink.

12 Claims, 1 Drawing Sheet

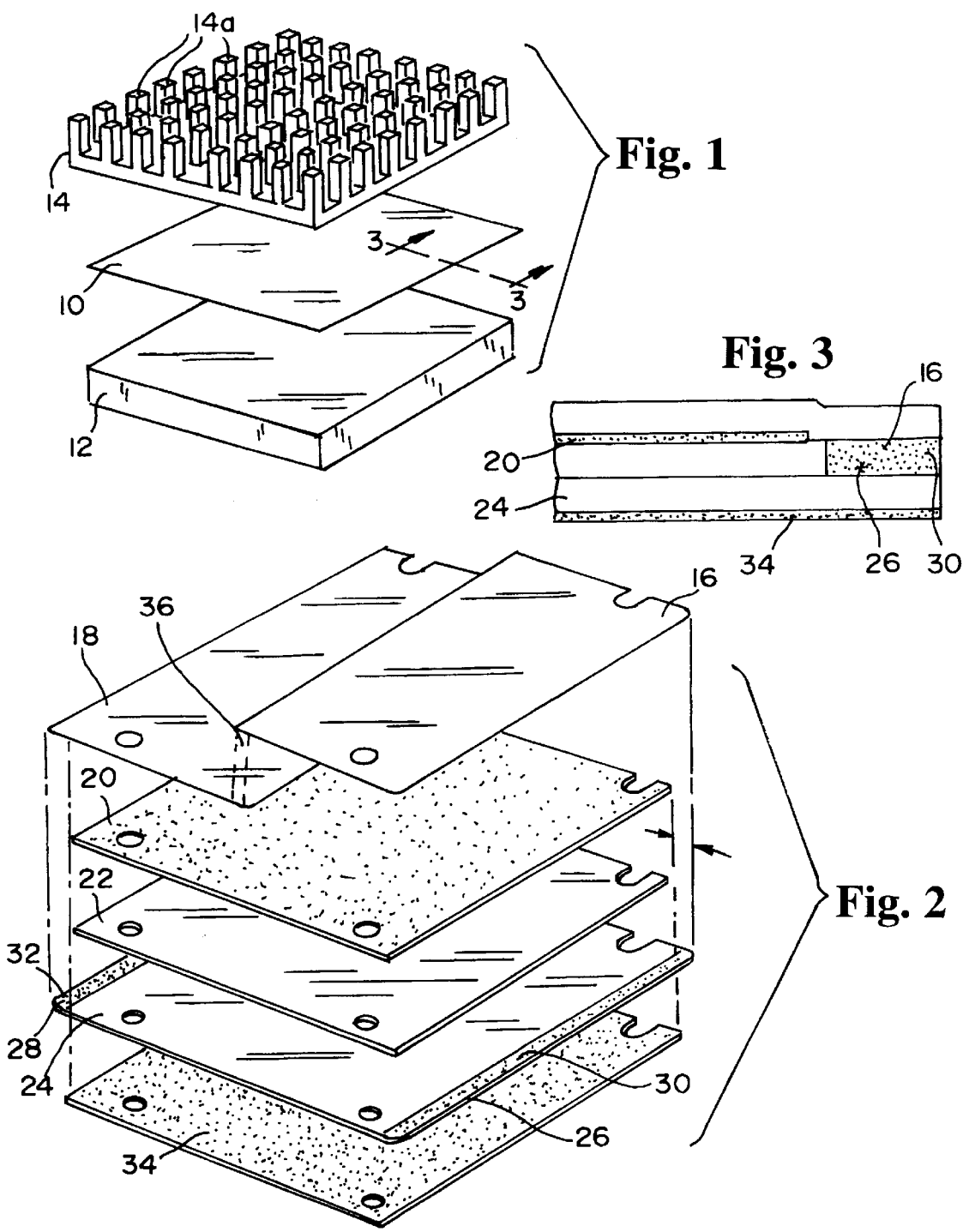

THERMAL INTERFACE WITH ADHESIVE

FIELD OF THE INVENTION

The present invention relates generally to heat transfer devices, and more particularly to a thermal interface for facilitating heat transfer from an electronic component to a heat sink so as to provide cooling for the electronic component to insure reliable and long-lived operation thereof.

BACKGROUND OF THE INVENTION

Interface systems for use in transferring heat produced from a heat-dissipating electronic component to a heat dissipator or heat sink are well-known in the art. In this regard, such electronic components, the most common being computer chip microprocessors, generate sufficient heat to adversely affect their operation unless adequate heat dissipation is provided. To achieve this end, such interface systems are specifically designed to aid in the transfer of heat by forming a heat-conductive pathway from the component to its mounting surface, across the interface, and to the heat sink.

Exemplary of such contemporary thermal interfaces are THERMSTRATE and ISOSTRATE (both trademarks of Power Devices, Inc. of Laguna Hills, Calif.). The THERMSTRATE interface comprises thermally conductive, die-cut pads which are placed intermediate the electronic component and the heat sink so as to enhance heat conduction therebetween. The THERMSTRATE heat pads comprise a durable-type 1100 or 1145 aluminum alloy substrate having a thickness of approximately 0.002 inch (although other aluminum and/or copper foil thickness may be utilized) that is coated on both sides thereof with a proprietary thermal compound, the latter comprising a paraffin base containing additives which enhance thermal conductivity, as well as control its responsiveness to heat and pressure. Such compound advantageously undergoes a selective phase-change insofar the compound is dry at room temperature, yet liquifies below the operating temperature of the great majority of electronic components, which is typically around 51° C. or higher, so as to assure desired heat conduction. When the electronic component is no longer in use (i.e., is no longer dissipating heat), such thermal conductive compound resolidifies once the same cools to below 51° C.

The ISOSTRATE thermal interface is likewise a die-cut mounting pad that utilizes a heat conducting polyimide substrate, namely, KAPTON (a registered trademark of DuPont) type MT, that further incorporates the use of a proprietary paraffin based thermal compound utilizing additives to enhance thermal conductivity and to control its response to heat and pressure. Advantageously, by utilizing a polyimide substrate, such interface is further provided with high dielectric capability.

The process for forming thermal interfaces according to contemporary methodology is described in more detail in U.S. Pat. No. 4,299,715, issued on Nov. 10, 1981 to Whitfield et al. and entitled METHODS AND MATERIALS FOR CONDUCTING HEAT FROM ELECTRONIC COMPONENTS AND THE LIKE; U.S. Pat. No. 4,466,483, issued on Aug. 21, 1984 to Whitfield et al. and entitled METHODS AND MEANS FOR CONDUCTING HEAT FROM ELECTRONIC COMPONENTS AND THE LIKE; and U.S. Pat. No. 4,473,113, issued on Sep. 25, 1984 to Whitfield et al. and entitled METHODS AND MATERIALS FOR CONDUCTING HEAT FROM ELECTRONIC COMPONENTS AND THE LIKE, the contents of all three of which are expressly incorporated herein by reference.

The prior art practice of adhesively bonding a thermal interface to either the electronic component or the heat sink is likewise well known. Such practice facilitates handling and expedites installation of the interface, as well as allows the heat conductive interface to be sold along with either the electronic component or the heat sink already in place thereupon.

According to contemporary practice, however, the use of an adhesive material to attach the heat conductive interface to either the electronic component or the heat sink is generally undesirable. In this regard, by introducing an additional layer to the interface system, namely in the form of adhesive, the ability of the interface to conduct the flow of heat thereacross is substantially reduced. As those skilled in the art will appreciate, the addition of a layer of material to an interface system, which is already typically comprised of multiple-layer construction, contributes three distinct impediments to heat flow, namely, each layer introduces the material of which the layer itself is comprised across which the heat must be conducted, as well as creates two interfaces at either surface of the layer.

Thus, it will be appreciated that it is highly desirable to minimize the number of layers, and consequently the number of interfaces, comprising an interface system. Along these lines, it has been found that the use of a thermal interface having six layers does not provide desirable heat transfer from a given electronic component to the heat sink coupled therewith. The use of an adhesive, and more particularly a layer thereof, for affixing an interface system in position between electronic component and heat sink further contributes to such inefficiency by introducing yet another layer at the interface between the electronic component and the heat sink which, as a consequence, substantially impedes heat flow. Accordingly, there has been and continues to exist a recognized problem of finding methods to securably mount such interface systems in fixed position between an electronic component and a heat sink, particularly through the use of adhesives, without such adhesive layer extending across or otherwise obtruding upon the interface surface across which heat is conducted. In addition, it should further be noted that from a practical standpoint, the manufacturing of such interface systems having multiple layers is expensive, and to add yet another layer further adds to an already considerable expense.

There is therefore a need in the art to provide a a thermal interface having a minimal number of layers and provides adequate heat dissipation but further utilizes an adhesive to attach the interface to either one of the electronic component or the heat sink coupled therewith. There is a further need in the art to provide a thermal interface which is adhesively bondable to either an electronic component or the heat sink coupled therewith which further does not substantially increase the manufacturing cost thereof as compared to contemporary thermal interface pads.

SUMMARY OF THE INVENTION

The present invention specifically addresses and alleviates the above-identified deficiencies associated with the prior art. More particularly, the present invention comprises a thermal interface for facilitating the transfer of heat from an electronic component to a heat sink that can be adhesively bonded to such componentry without diminishing the ability of the interface to efficiently transfer from the component to the heat sink. According to a preferred embodiment, the interface comprises first and second generally planar substrates compressively bonded to one another. Such substrates preferably comprise layers of foil having excellent thermal conductivity, and may preferably comprise a layer of THERMSTATE® AL-2-XXH. The second substrate is preferably sized such that the same has a larger surface area that overlaps and extends beyond at least a portion of the periphery of the first substrate. Upon the portion of the second substrate extending beyond the periphery of the first substrate is formed a layer of adhesive that is selectively positioned to facilitate adhesive bonding of the thermal interface to one of the electronic component and heat sink without becoming interposed therebetween.

There is further provided layers of conformable, heat-conducting material formed upon the opposed sides of the bonded substrates that are formulated to enhance heat transfer from the electronic component to the heat sink. Preferably, such heat-conducting material is formulated to have selective phase-change properties such that the material exists in a solid phase at normal temperature but melts when subjected to temperatures of approximately 51° C. or higher, which approximates the threshold temperature at which most electronic componentry operates. To facilitate packaging and handling of the interfaces of the present invention, there may further be provided one or more release or peel-away protective liners formed to the adhesive applied to the second substrate. When in place, the protective liner, which may preferably comprise silicone-treated paper, prevents exposure of the adhesive, but when pulled away exposes the adhesive so as to facilitate adhesive bonding of the thermal interface. Advantageously, the thermal interface utilizes a minimal number of layers, namely four layers, that are present at the actual interface between the electronic component and heat sink affixed thereto. The additional layer of adhesive used to bond the interface into position is kept away from the interface surface so as to not impede or otherwise interfere with the thermal conductivity.

It is therefore an object of the present invention to provide a thermal interface that may be adhesively secured in position relative an electronic component and a heat sink such that no portion of the adhesive becomes interposed therebetween.

Another object of the present invention is to provide an adhesively attachable thermal interface that utilizes a minimal number of layers in the construction thereof.

Still further objects of the present invention are to provide a thermal interface that may be adhesively secured in position relative a heat sink and electronic component that is of simple construction, may be readily fabricated from commercially-available materials, is relatively inexpensive to manufacture, and may be readily deployed with conventional electronic and heat sink componentry.

BRIEF DESCRIPTION OF THE DRAWINGS

These, as well as other features of the present invention, will become more apparent upon reference to the drawings, wherein:

FIG. 1 is an exploded perspective view of a heat sink positioned for attachment to an electronic component further showing a pre-formed thermal interface pad constructed in accordance with a preferred embodiment of the present invention being disposed therebetween;

FIG. 2 is an exploded perspective view of the respective layers comprising the thermal interface of the present invention; and FIG. 3 is a cross-sectional view taken along line 3—3 of FIG. 1.

DETAILED DESCRIPTION OF THE PREFERRED EMBODIMENT

The detailed description set forth below in connection with the appended drawings is intended merely as a description of the presently preferred embodiment of the invention, and is not intended to represent the only form in which the present invention may be constructed or utilized. The description sets forth the functions and sequence of steps for construction and implementation of the invention in connection with the illustrated embodiments. It is to be understood, however, that the same or equivalent functions and sequences may be accomplished by different embodiments that are also intended to be encompassed within the spirit and scope of the invention.

Referring now to the drawings, and initially to FIG. 1, there is shown a thermal interface 10 constructed in accordance to the preferred embodiment of the present invention. The thermal interface 10 is specifically designed and configured to facilitate the transfer of heat away from an electronic component 12 to a heat sink 14.

In this regard, the thermal interface 10 is specifically designed and adapted to be interposed between the electronic component 12 and heat sink 14. As is well-known, such heat sink 14 is provided with structures such as fins or other protuberances 14a having sufficient surface area to dissipate the heat into the surrounding air. Although not shown, to facilitate such heat dissipation, a fan is frequently utilized to provide adequate air circulation over the fins or protuberances 14a.

Preferably, the thermal interface 10 is die-cut or pre-formed to have a shape or footprint compatible with the particular electronic component and/or heat sink to thus enable the thermal interface 10 to maximize surface area contact at the juncture between the electronic component 12 and heat sink 14. Alternatively, the thermal interface 10 of the present invention may also be manually cut from a sheet of interface material, similar to other interface pads currently in use, so as to provide a custom fit between a given electronic component and heat sink.

As illustrated in FIG. 2, the thermal interface 10 is comprised of a multiplicity of layers. The first two layers 16, 18 comprise split release liners that do not comprise part of the thermal interface 10 itself, but facilitate the packaging and handling of such interface, discussed more fully below. Accordingly, in use it will be recognized that such liners are peeled away from the thermal interface 10 prior to deployment thereof.

With respect to the operative layers comprising the thermal interface 10, there is provided a first operative layer 20, which comprises a thermally conductive compound formulated to facilitate and enhance the ability of the interface 10 to transfer heat away from the electronic component to the heat sink. Similar to other prior art compositions, such layer 20 is preferably formulated to have certain desired phase-change properties. Specifically, at room temperature, i.e., when the electronic device is not operating, the layer of thermal compound 20, which is typically comprised substantially of paraffin, or a paraffin and petroleum jelly mixture, is preferably substantially solid and feels generally dry to the touch. When the electronic component is at operating temperature, however, the layer of the thermal compound 20 melts or flows so as to assure that any voids or gaps formed by surface irregularities become filled, thereby maintaining a generally continuous mechanical contact for heat transfer therefrom to the heat sink. When the electronic component returns to room temperature, i.e., is no longer in operation, the layer of thermal compound 20 reassumes a solid phase redistributed to conform to surface irregularities. As will be appreciated, when the interface 10 of the present invention is utilized on componentry having surfaces which are not perfectly flat, the thickness of the layer of thermal compound 20 may be adjusted accordingly, i.e., made thicker, so as to assure that any air gaps or voids that would otherwise be present are filled.

The second operative layer 22 consists of a generally planar substrate having a first outwardly facing side, oriented towards layer 20, and a second inwardly facing side. Preferably, the substrate 22 is fabricated from a metal foil such as copper, gold, silver and/or aluminum, or any other metal having excellent thermal conductive properties. One preferred substrate 22 comprises THERMSTRATE® AL-2XXH, which comprises an aluminum alloy substrate that further has coated on the respective sides thereof a proprietary thermal compound that facilitates the transfer of heat therethrough. Such thermal compound, similar to the layer of thermal compound 20 formed upon the substrate 22, likewise has desirable phase-change properties insofar as such proprietary compound assumes a solid phase at normal room temperatures, but liquifies at elevated temperatures of approximately 51° C. or higher, which approximates the operating temperatures of most electronic components in use.

A third operative layer 24 is further preferably provided that is compressively bonded or otherwise affixed to the second operative layer 22. Like the second operative layer 22, third operative layer 24 comprises a generally planar substrate provided with an outwardly facing side and an inwardly facing side, the latter being compressed against such substrate 22, as shown in FIG. 3. Such substrate 24 is likewise preferably fabricated from a foil having excellent thermal conductivity, and may likewise preferably comprise a layer of THERMSTRATE® AL-2-XXH.

Such substrate 24, however, is specifically sized such that at least a portion of the periphery thereof extends beyond the periphery defined by layers 20 and 22. In the specific embodiment shown in FIG. 2, such substrate 24 is provided with elongate strip portions 26, 28 on opposed sides thereof that extend beyond the sides of the other operative layers 20, 22. Formed upon such strip portions 26, 28 are layers of adhesive 30, 32 which, as will be appreciated by those skilled in the art, provide means for securing the thermal interface 10 of the present invention to either of an electronic component or heat sink coupled therewith. In this regard, the extended periphery of substrate 24 (i.e., strip portions 26, 28) with adhesive formed thereon will be specifically sized and formed such that such extended periphery and adhesive formed thereon extend beyond the interface between the electronic component and heat sink such that the layer of adhesive does not at any time become interposed therebetween. As such, the thermal interface of the present invention allows for an optimal transfer of heat from an electronic component to a heat sink coupled thereto that further enables the thermal interface to be adhesively secured in position therebetween, which thus provides all of the advantages (e.g., ease of installation and manufacture) accorded to adhesive attachment techniques.

As will be appreciated, the adhesive utilized in the practice of the present invention may take any of a variety of adhesives well-known to those skilled in the art. As will further be appreciated, however, such adhesive is provided only for the convenience of mounting such interface into position relative an electronic component and heat sink, and is not required for operation of the thermal interface. Notwithstanding, to the extent any type of adhesive is utilized in the practice of the present invention, it should be expressly recognized that such adhesive must be so applied to the interface system such that the same in no way encroaches upon or otherwise becomes introduced at the thermal interface between the electronic component and the heat sink, which is typical of prior art interface systems.

To further facilitate and enhance the thermal performance of the thermal interface 10 of the present invention, there is preferably provided a fourth operative layer 34 of a thermally conductive compound formed upon the outwardly facing surface of second substrate 24. As with first operative layer 20, the fourth layer 34 is preferably formulated to have certain desired phase-change properties, namely, the ability to assume a solid phase when the electronic component is not operating and liquify when subjected to the elevated operating temperatures of the electronic component, so as to ensure that any voids or gaps formed by surface irregularities present upon the interface mating surface, of the heat sink become filled, thereby maintaining a generally continuous mechanical contact to thus facilitate the transfer of heat to the heat sink coupled therewith.

As will be recognized by those skilled in the art, the interface 10 of the present invention, because of its novel construction, will only have four layers of material at the interface between the electronic component and the heat sink, namely, the first layer of thermal compound 20, first substrate 24, second substrate 24 and second layer of thermal compound 34, as illustrated in FIG. 3. Such construction, due to the minimal amount of layers utilized, is specifically configured for optimal heat transmission therethrough, and thus is ideally suited for application as a thermal interface for facilitating heat transfer from an electronic component to a heat sink. As those skilled in the art will further appreciate, by eliminating additional layers of material, which are typically present in prior art interfaces, there is thus facilitated the performance of heat transfer from the electronic component to a heat sink. In this regard, it is well-known that the rate of heat transfer through such interface is reduced by each layer added thereto.

Additionally, such interface 10, due to its incorporation of a layer of adhesive formed upon a portion of the periphery of second substrate 24 that extends beyond the interface surface between the electronic component and the heat sink, there is advantageously provided means for securing the interface 10 into position without having to incorporate the use of prior art attachment mechanisms, such as clips, clamps, fasteners, or other devices that must necessarily be utilized to assure adequate contact of the heat sink and electronic device at the interface thereof, as well as assure that the heat sink remains reliably attached to the electronic component. It should be understood, however, that such prior art attachment devices can be utilized in combination with the thermal interface of the present invention to the extent so desired.

With respect to the packaging of the thermal interface 10 of the present invention, it will be understood that to prevent exposure of the adhesive portions, such as 30 depicted in FIG. 3, during shipment and handling of the interface, there will necessarily be provided a paper backing or liner, such as 16 positioned thereupon. In this regard, after the adhesive 30 has been deposited upon the oversized peripheral portion 26 formed upon second substrate 24, such paper backing or liner will be placed thereupon to thus cover the adhesive 30 until the same must necessarily be exposed to secure the thermal interface 10 into position between a given electronic component and heat sink.

Such liners may take any of a variety known in the art, and may preferably comprised silicone-coated paper, which may easily be peeled away from the interface 10 without deforming the same. In the embodiment shown more clearly in FIG. 2, a split liner comprised of two separate liners 16, 18 are provided that protectively cover dedicated strips of adhesive 30, 32 formed upon the extended peripheral portions 26, 28 of second substrate 24, as well as cooperate to cover first operative interface layer 20. The liners 16, 18 are preferably formed to slightly overlap one another along a central or medial strip 36 extending therebetween to insure proper protection of not only the adhesive strips formed upon the second substrate, but the entire interface 10 as well.

Although the invention has been described herein with specific reference to a presently preferred embodiment thereof, it will be appreciated by those skilled in the art that various, modifications, deletions, and alterations may be made to such preferred embodiment without departing from the spirit and scope of the invention. For example, it will be recognized that the extended, oversized portion of the second substrate 24 upon which the adhesive is applied may be formed anywhere about the periphery of such substrate to thus enable the same to be advantageously secured into position for particular application. Accordingly, it is intended that all reasonably foreseeable additions, modifications, deletions and alterations be included within the scope of the invention as defined in the following claims.

What is claimed is:

1. A thermal interface for facilitating heat transfer from an electronic component to a heat sink comprising:

a) a first generally planar substrate having first and second surfaces and defining a first continuous peripheral edge;

b) a second generally planar substrate having first and second surfaces and defining a second continuous peripheral edge, said first surface of said second substrate being compressively bonded to said second surface of said first substrate such that at least a portion of said second peripheral edge extends beyond said first peripheral edge;

c) a layer of adhesive formed upon said portion of said second peripheral edge extending beyond said first peripheral edge;

d) a first layer of conformable, heat-conducting material formed upon said first surface of said first substrate, said heat-conducting material being formulated to enhance the heat transfer from said electronic component to said heat sink; and e) a second layer of conformable, heat-conducting material formed upon the second surface of said second substrate, said heat-conducting material being formulated to enhance the heat transfer from said electronic component to said heat sink.

2. The thermal interface of claim 1 wherein said portion of said second peripheral edge extending beyond said first peripheral edge extends substantially beyond the interface mating surface between said electronic component and said heat sink.

3. The thermal interface of claim 1 wherein a portion of said second peripheral edge defined by said second substrate substantially overlaps said first continuous peripheral edge defined by said first substrate.

4. The thermal interface of claim 1 wherein said first and second substrates comprise a thermally conductive metal foil.

5. The thermal interface of claim 4 wherein said first and second substrates are formed from the group consisting of copper, gold, silver and aluminum.

6. The thermal interface of claim 1 wherein said first and second substrates are formed from THERMSTRATE® AL-2-XXH.

7. The thermal interface of claim 1 wherein said first and second layers of conformable, heat-conducting material are formulated to have a melting point of approximately 51° C. or higher.

8. The thermal interface of claim 1 wherein said adhesive is deposited upon said first surface of said second substrate.

9. The thermal interface of claim 1 wherein said adhesive is deposited upon said second surface of said second substrate.

10. The thermal interface of claim 1 further comprising:

f) a peel-away protective layer formed to said adhesive formed upon said portion of said peripheral edge of said second substrate; and g) wherein peeling away said peel-away protective layer exposes said layer of adhesive on said second substrate so as to facilitate adhesive bonding of said thermal interface to one of said electronic component and said heat sink.

11. The thermal interface of claim 10 wherein said peel-away protective layer comprises paper.

12. The thermal interface of claim 10 wherein said peel-away protective layer comprises silicone-coated paper.

* * * * *